US006318869B1

(12) United States Patent
Hudyma

(10) Patent No.: US 6,318,869 B1
(45) Date of Patent: *Nov. 20, 2001

(54) HIGH NUMERICAL APERTURE RING FIELD PROJECTION SYSTEM FOR EXTREME ULTRAVIOLET LITHOGRAPHY

(76) Inventor: Russell Hudyma, 218 Eastridge Dr., San Ramon, CA (US) 94583-4905

( * ) Notice: Subject to any disclaimer, the term of this patent is extended or adjusted under 35 U.S.C. 154(b) by 0 days.

This patent is subject to a terminal disclaimer.

(21) Appl. No.: 09/697,071

(22) Filed: Oct. 26, 2000

Related U.S. Application Data

(60) Continuation of application No. 09/453,425, filed on Dec. 2, 1999, now Pat. No. 6,183,095, which is a division of application No. 09/270,127, filed on Mar. 15, 1999, now Pat. No. 6,033,079.

(51) Int. Cl.[7] ........................................ G02B 5/08

(52) U.S. Cl. .................. 359/857; 359/858; 359/859; 359/364; 359/365; 359/366

(58) Field of Search .................. 359/857, 858–859, 359/861–862, 713, 729–731, 355, 364–366, 368; 378/34, 35; 355/49, 51–54, 57; 250/1, 4

(56) References Cited

U.S. PATENT DOCUMENTS

| | | | |
|---|---|---|---|
| 5,063,586 | * 11/1991 | Jewell et al. | 378/34 |
| 5,071,240 | 12/1991 | Ichihara et al. | 359/366 |
| 5,078,502 | 1/1992 | Cook | 359/366 |

FOREIGN PATENT DOCUMENTS 0 779 528 A2    6/1997   (EP) .

OTHER PUBLICATIONS

"Design of Reflective Relay for Soft X–Ray Lithography", J. M. Rodgers, T.E. Jewell, International Lens Design Conference, 1990.

"Optical System Design Issues in Development of Projection Camera for EUV Lithography", T.E. Jewell, SPIE vol. 2437, pp. 340–347.

"Ring–Field EUVL Camera with Large Etendu", W.C. Sweatt, OSA TOPS on Extreme Ultraviolet Lithography, 1996.

"Phase Shifting Diffraction Interferometry for Measuring Extreme Ultraviolet Optics", G.E. Sommargaren, OSA TOPS on Extreme Ultraviolet Lithography, 1996.

"EUV Optical Design for a 100 nm CD Imaging System", D.W. Sweeney, R. Hudyma, H.N. Chapman, and D. Shafer, SPIE vol. 3331, pp. 2–10.

"Reflective Systems design Study for Soft X–ray Projection Lithography", T.E. Jewell, J.M. Rodgers, and K.P. Thompson, J. Vac. Sci. Technol., Nov./Dec. 1990.

(List continued on next page.)

Primary Examiner—Mohammad Sikder
(74) Attorney, Agent, or Firm—Sierra Patent Group, Ltd.; Andrew V. Smith

(57) ABSTRACT

An all-reflective optical system for a projection photolithography camera has a source of EUV radiation, a wafer and a mask to be imaged on the wafer. The optical system includes a first concave mirror, a second mirror, a third convex mirror, a fourth concave mirror, a fifth convex mirror and a sixth concave mirror. The system is configured such that five of the six mirrors receives a chief ray at an incidence angle of less than substantially 12°, and each of the six mirrors receives a chief ray at an incidence angle of less than substantially 15°. Four of the six reflecting surfaces have an aspheric departure of less than substantially 7 μm. Five of the six reflecting surfaces have an aspheric departure of less than substantially 14 μm. Each of the six reflecting surfaces has an aspheric departure of less than 16.0 μm.

6 Claims, 6 Drawing Sheets

OTHER PUBLICATIONS

| | | |
|---|---|---|
| 5,153,898 | 10/1992 | Suzuki et al. . |
| 5,212,588 | 5/1993 | Viswanathan et al. . |
| 5,220,590 | 6/1993 | Bruning et al. . |
| 5,315,629 * | 5/1994 | Jewell et al. .......................... 378/34 |
| 5,353,322 | 10/1994 | Bruning et al. . |
| 5,410,434 | 4/1995 | Shafer . |
| 5,608,526 | 3/1997 | Piwonka-Corle et al. . |
| 5,686,728 | 11/1997 | Shafer . |
| 5,805,365 | 9/1998 | Sweatt ................................. 359/858 |
| 5,815,310 | 9/1998 | Williamson . |
| 5,956,192 | 9/1999 | Williamson ......................... 359/859 |
| 6,014,252 | 1/2000 | Shafer ................................. 359/355 |
| 6,072,852 | 6/2000 | Hudyma ............................... 378/34 |
| 6,183,095 * | 2/2001 | Hudyma ............................... 359/857 |

* cited by examiner

HIGH NUMERICAL APERTURE RING FIELD PROJECTION SYSTEM FOR EXTREME ULTRAVIOLET LITHOGRAPHY

PRIORITY

This is a continuation of application Ser. No. 09/453,425, filed Dec. 2, 1999 now U.S. Pat. No. 6,183,095 which is a divisional of Ser. No. 09/270,127, filed Mar. 15, 1999 now U.S. Pat. No. 6,033,079.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The invention relates to a high numerical aperture ring field projection optical system for extreme ultraviolet (EUV) photolithography, and particularly to an all-reflective optical system for the camera having six reflecting surfaces with low aspheric departure, and small angles of incidence.

2. Discussion of the Related Art

Short wavelength radiation sources are being used for producing small features on semiconductor wafers, because the size of the smallest features producible using photolithographic techniques, or the critical dimension (CD), depends directly on the wavelength of the source radiation. For this reason, extreme ultraviolet (EUV) radiation is a promising radiation source, having wavelengths in the 4 to 30 nm range. Today, extreme ultraviolet (EUV) projection lithographic technology can be used to produce features sizes that are less than 100 nm.

The photolithographic systems for producing these small feature sizes preferably include all-reflective optics. Dioptric and Catadioptric type projection systems used today for deep ultraviolet (DUV) lithography including refractive optics are not desirable for use in extreme ultraviolet (EUV) lithography systems due to absorption of the EUV radiation in the bulk optical material.

At any given mirror of an optical system, it is useful to quantify the incidence angles of the imaging bundle with respect to the "chief ray." The chief ray from a given field point is the ray that emanates from this field point and passes through the center of the aperture stop. To a good approximation, the mean angle of incidence of any mirror can be estimated by the angle of incidence of the chief ray that emanates from the field point that lies in the center of the ring field. To be more precise, this field point lies in the tangential plane of the projection system at the midpoint of the radial extremum of the arcuate field.

EUV projection lithography is enabled by multilayer coatings that are capable of reflecting approximately 70% of the incident EUV radiation. EUV multilayers include bilayers of Mo/Si and Mo/Be which have been under development for a number of years and are well understood. It is understood in the present invention that since these multilayers rely on a periodic structure to build a reflected wavefront, their performance is sensitive to changes in incidence angle and wavelength.

All-reflective projection lithographic camera systems that support 100 nm resolution with a numerical aperture (NA) in the range of 0.08 to 0.10 are well established in the patent literature. These systems are centered 3- and 4-mirror reflective anastigmats that are optimized to operate over a narrow ringfield. Since it is difficult to control field dependent aberrations (i.e., astigmatism and distortion) to EUV requirements, freedom to control the pupil dependence of the aberrations is necessarily limited. As a result, the numerical aperture of these systems is necessarily restricted to approximately 0.10 for ring field of any substantial width (1.5 mm).

The theoretical resolution (R), or critical dimension (CD) of a lithographic imaging system can be expressed by the well-known relationship $R=CD=k_1 \lambda/NA$, where $k_1$, is a process dependent constant, $\lambda$ is the wavelength of light, and NA is the numerical aperture of the projection system. For example, an EUV projection system using a 13.4 nm radiation source and having a $k_1$, factor of 0.6 and a 0.25 NA can achieve a theoretical resolution on the order of approximately 30 nm. As the critical dimension is reduced, the static distortion should be correspondingly reduced. Specifically, depending on the critical dimension, the static distortion should be reduced to less than about ⅓ at most, and preferably and generally to less than ¹⁄₁₀ of the critical dimension. For example, if CD is 30 nm, then the static distortion should be reduced to less than 3 nm. The static distortion is a measure of the average positional error of focused rays within the focal plane of an optical system. It is desired to have an unobscured multi-mirror projection systems for EUV projection lithography that has both a large numerical aperture that is on the order of 0.25 and low static distortion that is on the order of ¹⁄₁₀ of the critical dimension (CD) or less. Clearly, these projection systems are needed if EUV lithography is to address the sub-100 nm linewidth generations as defined by the SIA roadmap.

One of the first optical systems to address this high NA EUV requirement is disclosed in U.S. Pat No. 5,212,588 entitled, "Reflective Optical Imaging System for Extreme Ultraviolet Wavelengths" issuing to Viswanathan et al., which is herein incorporated by reference. A multi-bounce projection system that incorporates two coaxial aspheric mirrors in a four-bounce configuration is disclosed by Viswanathan and Newnam in the '588 patent and is reproduced at FIG. 1 herein. Mirror M1 is convex and mirror M2 is concave. To obtain high-resolution imagery, the field curvature should be corrected such that the sum of the curvatures of the focusing surfaces of the system, known as the "Petzval sum", are substantially zero. This is known as the "flat field condition." Viswanathan and Newnam designed the system disclosed in the '588 patent so that the two mirrors M1 and M2 have substantially the same radius of curvature, and since M1 is convex and M2 is concave, the flat field condition is satisfied. While the '588 patent describes a number of embodiments with excellent performance over a range of numerical aperture up to 0.3 at DUV wavelengths, all of these embodiments suffer from one common flaw: the exit pupil is centrally obscured by mirror M1. This central obscuration will degrade the MTF response of the system at the mid-spatial frequencies relative to the cut-off frequency. Since the obscuration is large, this loss of contrast will lead to CD variation across the field and yield unacceptable lithographic imaging performance effectively reducing the lithographic process window. Furthermore, the mask (and hence the wafer) plane would be tilted to enable the use of a reflective mask. This introduces added engineering difficulties when a production environment is considered.

The high NA EUV requirement is also discussed briefly by the disclosure in U.S. Pat. No. 5,315,629 entitled, "Ringfield Lithography" issuing to Jewell et al., which is herein incorporated by reference. Jewell and Thompson disclose in the '629 patent that their four-mirror, positive, negative, positive, positive (or PNPP) configuration can be used at a numerical aperture of 0.14, ". . . without significant loss in image quality (still diffraction-limited performance), if the image distortion requirement is relaxed." Jewell and Thompson do not quantify what this relaxation is, but their basic system, reproduced herein at FIG. 2, with a NA of 0.10, has approximately 10 nm of distortion across a 0.5 mm ring. As the numerical aperture of their system is scaled-up, the ability to control the distortion is lost since the available degrees of freedom are consumed to correct aberrations that scale with the NA. A study of the Jewell and Thompson design reveals that the distortion grows to around 30–40 nm at the edge of the ring field as other aberrations are corrected at this increased numerical aperture. This is simply too much distortion for a practical lithographic reduction system, even when the effects of scan-averaging are included.

Neither the two mirror system of Viswanathan nor the four-mirror system of Jewell and Thompson has sufficient degrees of freedom. It is difficult, if not impossible, to configure a four-mirror optical system to produce a system having satisfactorily high NA (i.e., at least o.25), large ringfield width (i.e., at least 2 mm) and low static distortion (i.e., less than CD/10). For example, starting with either of the systems of FIGS. 1 and 2, the relative positions of the mask, wafer and four mirrors, optimizing the sign and/or magnitude of the curvatures of the four mirrors, and the aspheric profiles of the mirrors, leads to unsatisfactory results.

Ringfield width has a direct influence on wafer throughput, directly influencing the cost of ownership of a lithography system. A system having an increased ringfield width, e.g., 2.0–3.0 mm, has a correspondingly increased throughput. However, the system must still maintain low distortion across its ringfield width if it is to be useful. Static distortion will generally increase with increased ringfield width, but still should be corrected to less than substantially CD/10.

Generally, four-mirror systems simply do not have a sufficient number of degrees of freedom to correct aberrations such as distortion at a numerical aperture of 0.25 over any meaningful field size. The number of degrees of freedom can be increased by adding optical surfaces in such a manner as to enhance the simultaneous correction of both the field and pupil dependent aberrations across the narrow ring field. Since the step and scan method is used to print the entire field, it is practical to investigate solutions with an even number of reflections so that the mask and wafer can be placed on opposing sides of the system to ensure interference-free travel of the mask and wafer. It is desired then to investigate systems having at least six reflective surfaces.

Recently, optical projection reduction systems have been disclosed that offer high numerical apertures with six and eight reflections. One such system is disclosed in U.S. Pat No. 5,686,728 entitled, "Projection Lithography System and Method Using All-Reflective Optical Elements," issuing to Shafer, which is herein incorporated by reference. In the '728 patent, Shafer describes an eight mirror projection system with a numerical aperture of around 0.50 and a six mirror projection system with a numerical aperture of around 0.45. The eight and six mirror systems of Shafer are reproduced, respectively, at FIGS. 3a and 3b herein.

These systems were designed for DUV lithography, and, while fine for that purpose, are not necessarily suitable for EUV projection lithography, even after the NA has been reduced from around 0.50 to around 0.25. By way of example, mirror M1 in the six mirror embodiment of FIG. 3b is essentially flat making it difficult to test with state of the art visible light interferometers designed to measure aspheric mirrors to the required accuracy (see Gary E. Sommergren, "Phase Shifting Diffraction Interferometry for Measuring Extreme Ultraviolet Optics", OSA TOPS on Extreme Ultraviolet Lithography, Vol. 4, pp. 108–112 (1996)).

Another high numerical aperture projection system is the disclosure in U.S. Pat. No. 5,815,310 entitled, "High Numerical Aperture Ring Field Optical Reduction System" issuing to Williamson, which is herein incorporated by reference. In the '310 patent, Williamson describes two six mirror ring field projection systems intended for use with both DUV and EUV radiation. A first arrangement of Williamson, reproduced herein at FIG. 4a, consists, from long conjugate to short conjugate, of concave, convex, concave, concave, convex, and concave surfaces, or PNPPNP for short. This projection system has a numerical aperture of 0.25 and is intended for EUV radiation. A second arrangement of Williamson, reproduced herein at FIG. 4b consists, from long conjugate to short conjugate, of concave, convex, concave, concave, convex, and concave surfaces, or PNPPNP for short. This projection system has a numerical aperture of 0.55 and is intended for DUV radiation. Referring specifically to FIG. 4a, the projection system is capable of 30 nm lithography using conservative values for $k_1$ around 0.6. Williamson discloses both the PNPPNP and the PPPPNP reimaging configurations locating an intermediate image in various locations, always near the mirror pair comprising the third and fourth concave mirrors.

The EUV arrangement suffers from the following drawbacks. First, large peak aspheric departures are present on each of mirror M1 and mirror M5. To enable tests of the surface figure, a complex null lens or computer generated hologram (CGH) is needed to provide the required aspheric reference wavefront. Using a null lens or CGH would seriously compromise the absolute accuracy of the test and could potentially lead to errors that would prevent convergence to the proper aspheric figure. Aspheric departures on the order of less than approximately 15 $\mu$m across any reasonably sized clear aperture would enable a center of curvature test using visible light metrology without using a null lens or CGH. The peak departures on mirrors M1 and M5 of the '310 patent of Williamson are 30 $\mu$m and 18.5 $\mu$m, respectively, across the clear aperture of the off-axis section. In all likelihood, these large departures require the use of a null lens, a CGH or a data reduction scheme whereby multiple subaperture data sets are "stitched" together. Neither of these metrology techniques is preferred. A system with mirrored surfaces each having low aspheric departure is desired.

Another issue with the systems disclosed by Williamson is the high incidence angles at each of the mirrored surfaces, particularly on mirrors M2 and M3. In some instances, the angle of incidence exceeds 24° at a given location of a mirror. Both the mean angle and deviation or spread of angles is sufficient to cause noticeable amplitude and phase effects due to the EUV multilayer coatings.

SUMMARY OF THE INVENTION

It is recognized in the present invention that multilayer coatings are formed to optimally reflect rays of light incident at predetermined incidence angles. It is further recognized that the reflectivity of these coatings will decrease more rapidly for rays incident at angles varying from the predetermined incidence angle as the predetermined incidence angle is increased. That is, projection systems are more susceptible to phase errors induced by the multilayers when the mean angle of incidence is greater. Therefore, to be compatible with multilayer coatings, the mean incidence angle at the mirrors of the projection lithography system should be minimized. Preferably, the angle of incidence of the chief ray from the central field point is less than substantially 12°–15°. Moreover, the angular deviation of the imaging bundles at any point on the mirror should also be minimized. This minimization would act to reduce both phase and amplitude errors imparted to the imaging bundle by the multilayers. By reducing these phase and amplitude errors, a robust EUV projection lithography optical system is achieved.

It is desired to have an all-reflective optical system for EUV photolithography having at least six reflective surfaces, thereby having sufficient degrees of freedom to form highly corrected images. It is also desired to configure the system such that each reflective surface receives the EUV light at a low angle of incidence. Each reflective surface of the desired system would also preferably have low aspheric departure to improve manufacturability and testability. The desired system would then be suited to resolve sub-100 nm features based on a large NA and the short wavelength EUV radiation source being used. The system would feature an enhanced ringfield width for greater wafer throughput while having low static distortion across the width.

It is therefore a first object of the present invention to provide an all-reflective optical imaging system for extreme ultraviolet (EUV) photolithography including at least six reflecting surfaces configured to receive light from an EUV source at low angles of incidence.

It is a second object of the invention to provide an all-reflective optical imaging system for EUV lithography including at least six reflecting surfaces wherein the reflecting surfaces exhibit low aspheric departures.

It is a third object of the invention to provide an all-reflective optical imaging system for EUV lithography including at least six reflecting surfaces and having a large NA, a large ringfield width, and a low distortion such that small features may be resolved and large wafer throughput may be realized.

In accord with the first object, an all-reflective optical imaging system is provided for EUV photolithography having a first concave mirror, a second convex or concave mirror, a third convex mirror, a fourth concave mirror, a fifth convex mirror and a sixth concave mirror. The mirrors are configured such that each receives EUV light at a low incidence angle. For example, five of the six mirrors may receive the chief ray from the central field point at an angle of incidence of less than substantially 9°, or alternatively 12°, and all six mirrors may each receive the chief ray at less than substantially 13°, or 15°, respectively.

In accord with the second object, an all-reflective optical imaging system is provided for EUV photolithography having at least six reflecting surfaces, wherein from long conjugate to short conjugate the first mirror is concave and four of the six reflecting surfaces has an aspheric departure of less than substantially 7 $\mu$m, five of the six reflecting surfaces has an aspheric departure of less than substantially 11 $\mu$m, or alternatively 14 $\mu$m, and each reflecting surface has an aspheric departure of not more than substantially 15 $\mu$m, or 16 $\mu$m, respectively.

In further accord with the second object, an all-reflective optical imaging system is provided for EUV photolithography having at least six reflecting surfaces, wherein from long conjugate to short conjugate the first mirror has a concave reflecting surface and an aspheric departure between between 9 $\mu$m and 21 $\mu$m, or alternatively between 3.8 $\mu$m and 8.8 $\mu$m. The second mirror has an aspheric departure between 0.3 $\mu$m and 0.7 $\mu$m, or between 2.6 $\mu$m and 5.4 $\mu$m, respectively. The third mirror has an aspheric departure between 8 $\mu$m and 18 $\mu$m, or between between 1 $\mu$m and 2.4 $\mu$m, respectively. The fourth mirror has an aspheric departure between 1.5 $\mu$m and 3.7 $\mu$m, or between between 2.7 $\mu$m and 6.3 $\mu$m, respectively. The fifth mirror has an aspheric departure between 3 $\mu$m and 7 $\mu$m, or between 6 $\mu$m and 14 $\mu$m, respectively. The sixth mirror has an aspheric departure between 3.8 $\mu$m and 8.8 $\mu$m, or between 8.9 $\mu$m and 18.7 $\mu$m, respectively.

In accord with the third object, an all-reflective optical imaging system is provided for EUV photolithography including at least six reflecting surfaces, and having a NA between 0.2 and 0.3 or better, distortion corrected to better than 1.0 nm, and a ringfield width between substantially 2.0 mm and 3.0 mm or wider. The system is capable of resolving sub-100 nm structures at the wafer reliably and efficiently.

DETAILED DESCRIPTION OF THE PREFERRED EMBODIMENT

Figure 1:
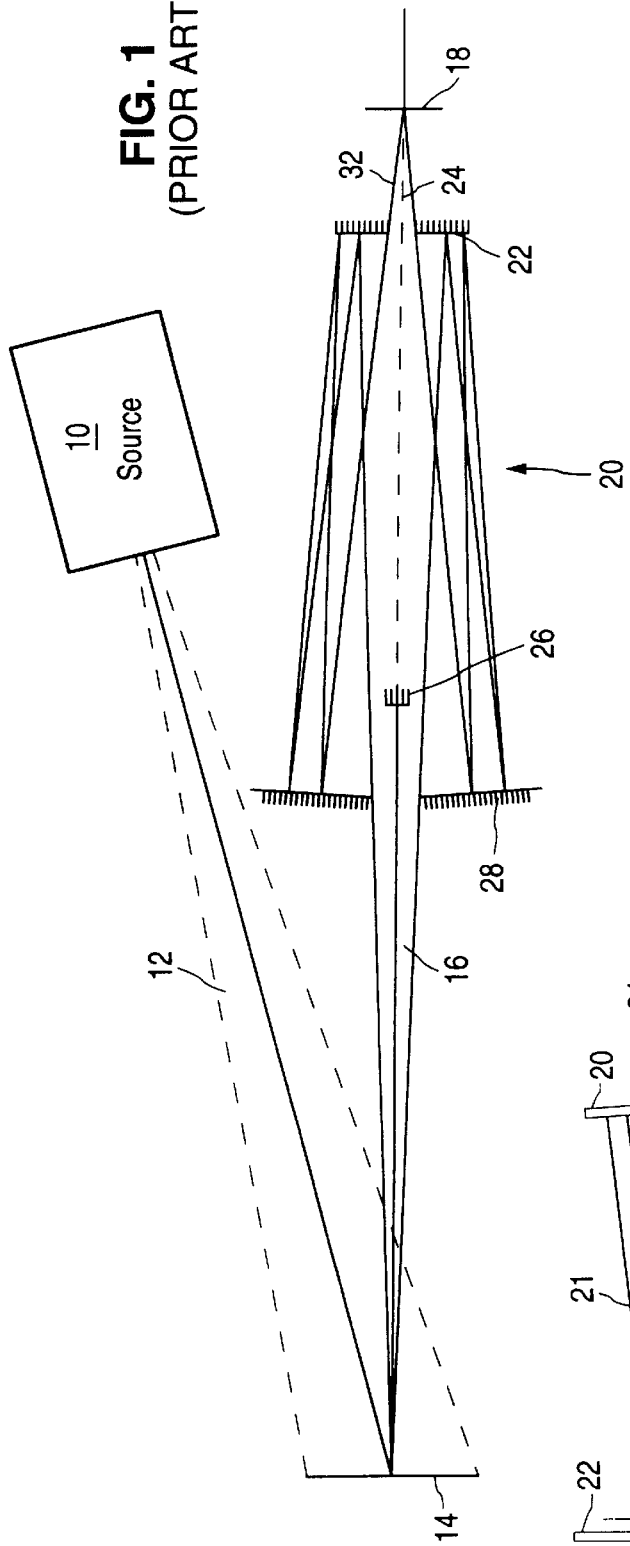
FIG. 1 shows a first projection lithography optical system of the prior art.
Figure 2:
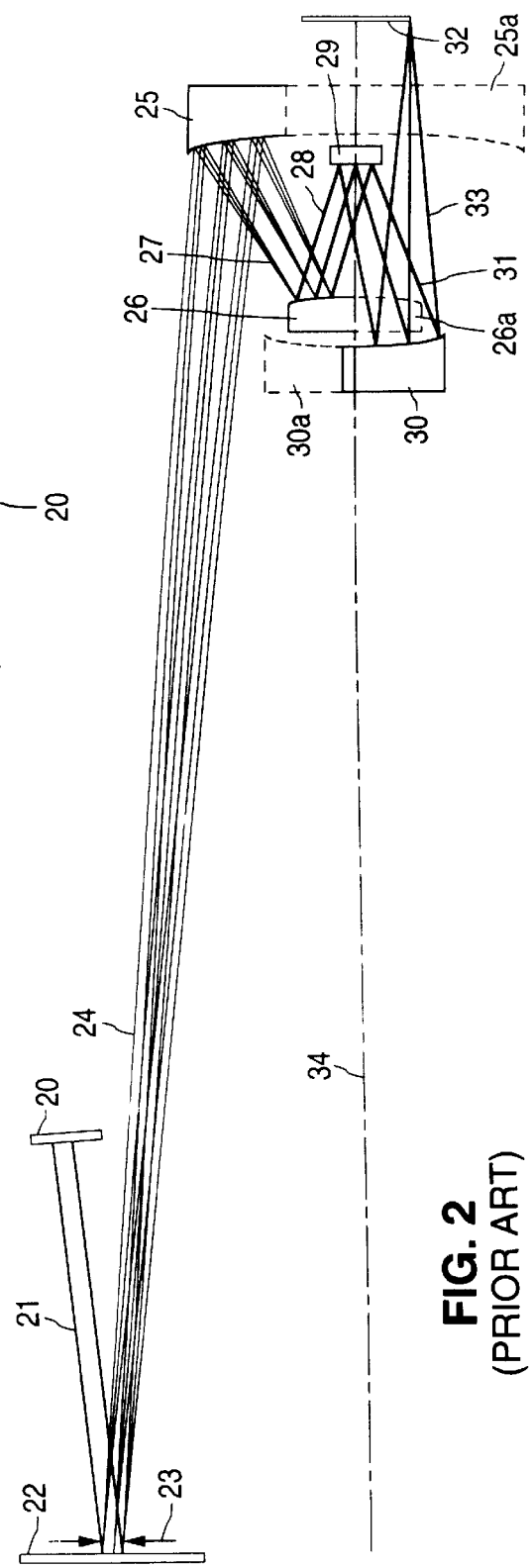
FIG. 2 shows a second projection lithography optical system of the prior art.
Figure 3A:
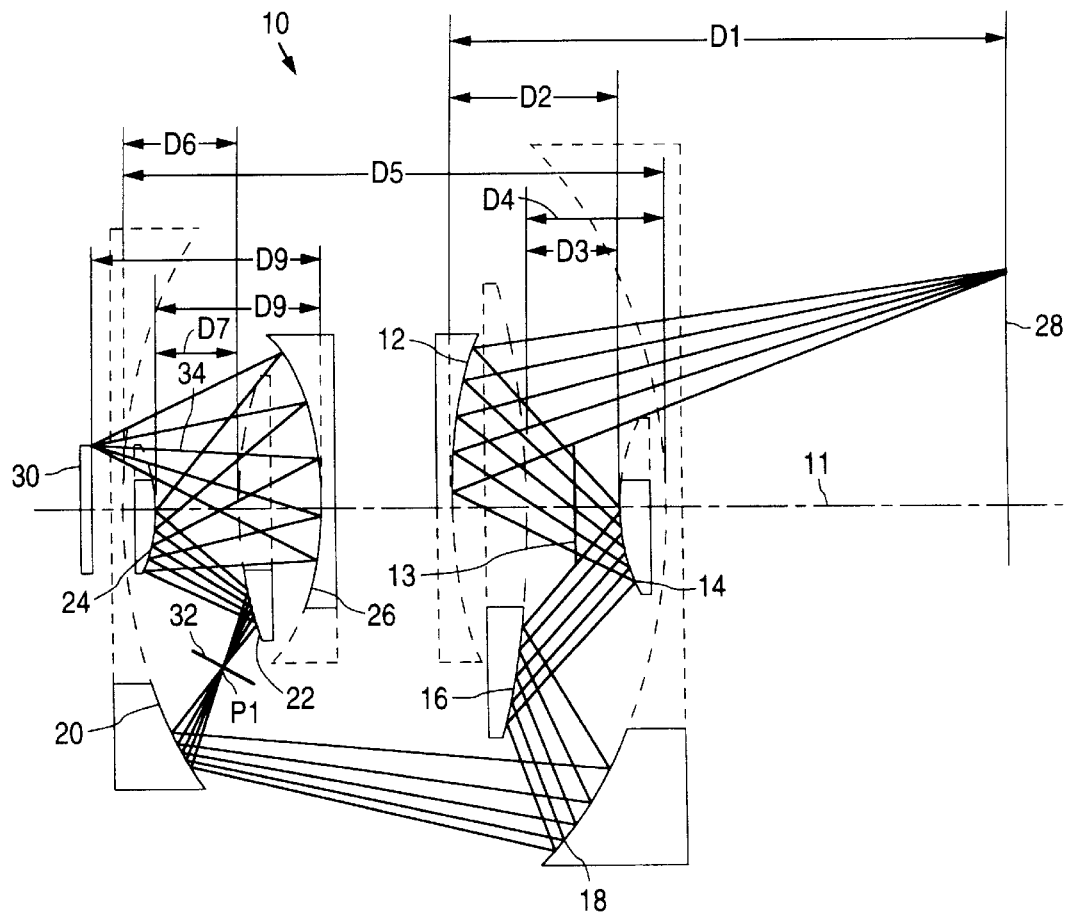
FIG. 3a shows a third projection lithography optical system of the prior art.
Figure 3B:
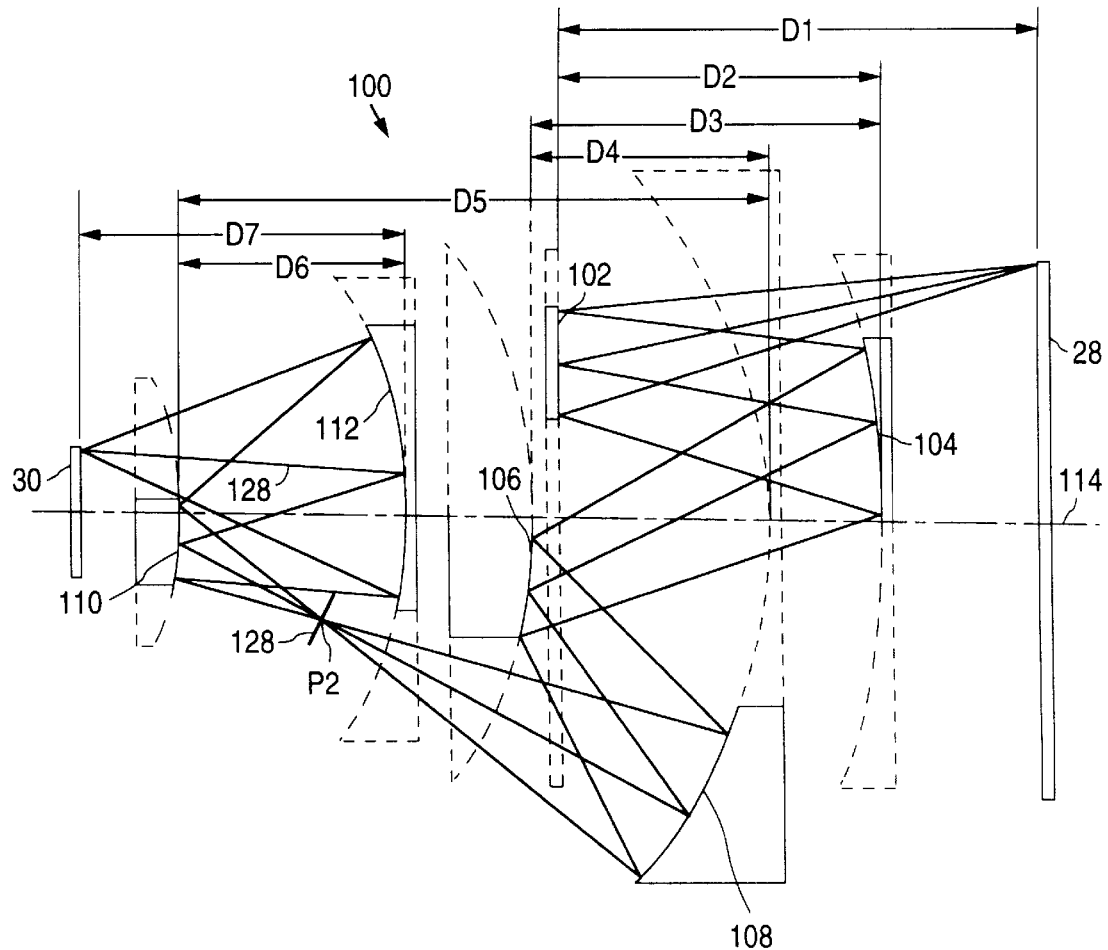
FIG. 3b shows a fourth projection lithography optical system of the prior art.
Figure 4A:
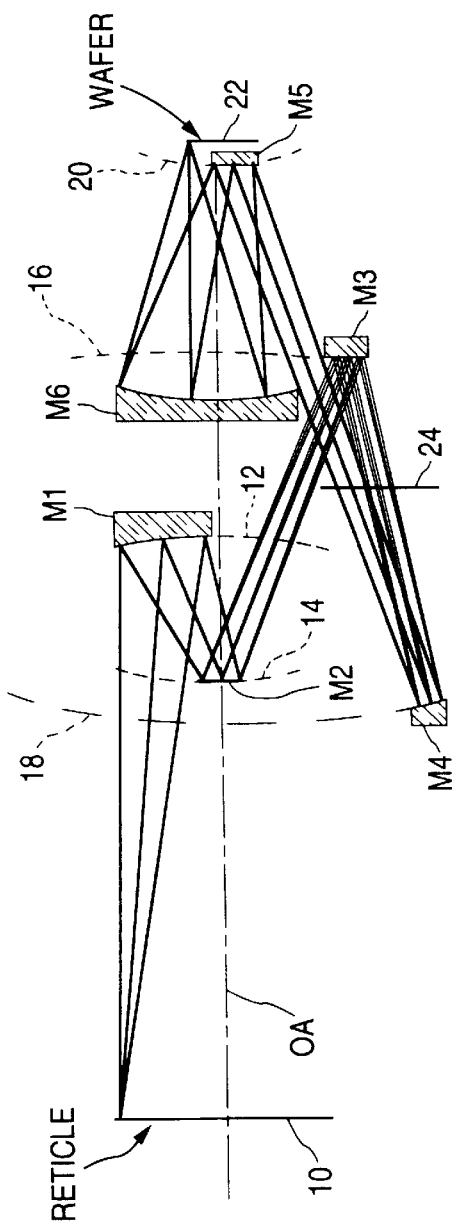
FIG. 4a shows a fifth projection lithography optical system of the prior art.
Figure 4B:
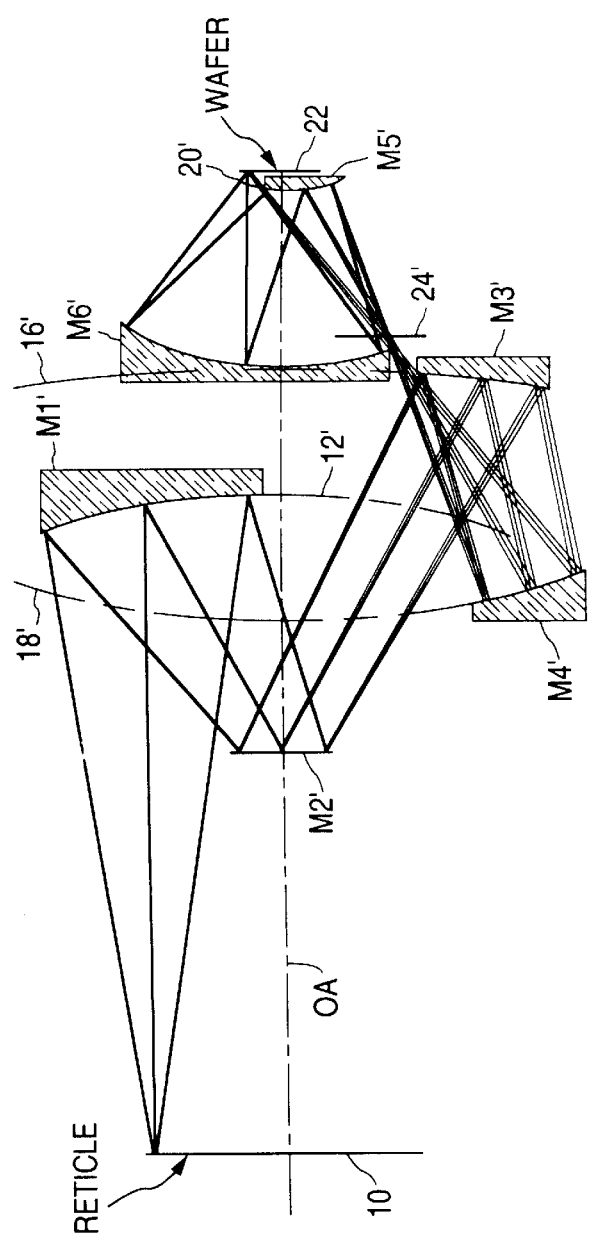
FIG. 4b shows a sixth projection lithography optical system of the prior art.
Figure 5:
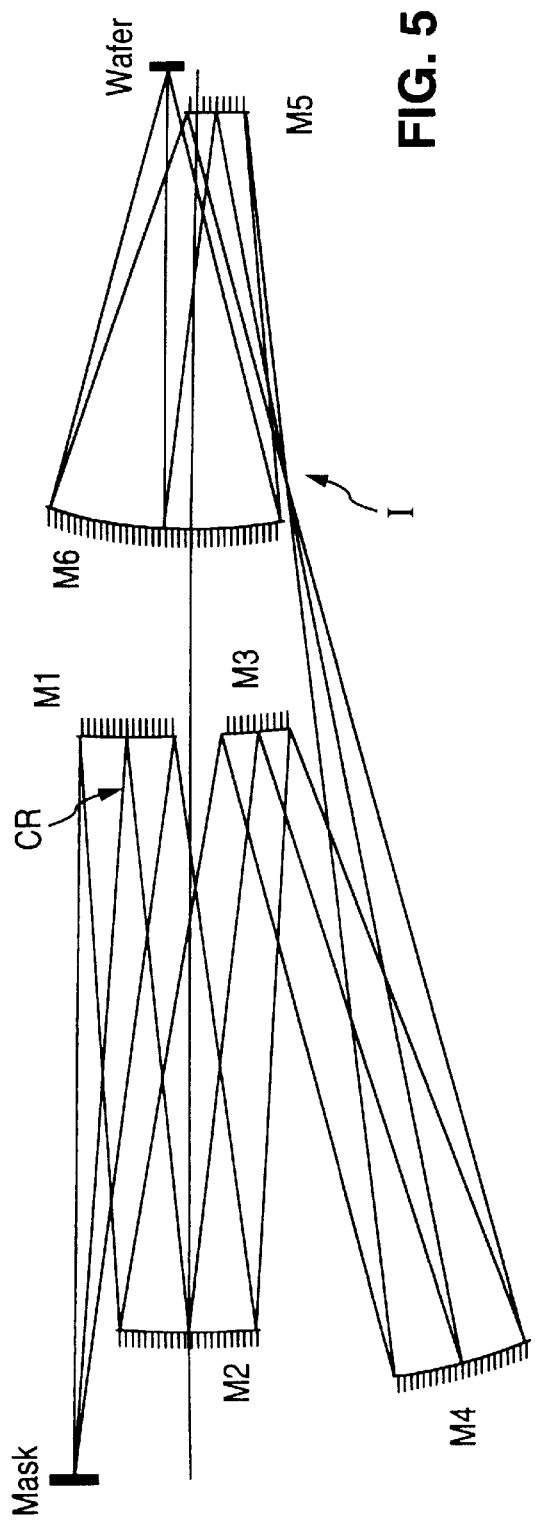
FIG. 5 shows a projection lithography optical system including an optical system in accord with a first embodiment of the present invention.

A first preferred embodiment of an EUV optical projection system according to the present invention is shown in FIG. 5. To provide a high numerical aperture on the order of 0.25, the six mirror system of FIG. 5 addresses the aforementioned problems of the systems that define the current state of the art. Linewidths on the order of 30 nm are resolveable with this six mirror design. For example, 32 nm resolution is achieved by a system having a 13.4 nm source, a $k_1$ value of 0.6 and a numerical aperture of 0.25 (using R=k$\lambda$/NA). A linewidth of 27 nm is achieved using an 11.3 nm source.

First Preferred Embodiment: PPNPNP Optical Reduction System

The radii, aspheric prescription, and the axial separation of the mirrors of the system of FIG. 5 are shown in Table 1. Specification data as defined at the plane of the mask are also included in Table 1.

In the first embodiment of the projection system of the present invention, as shown in FIG. 5 from long conjugate to short conjugate, the first mirror is concave, the second concave, the third convex, the fourth concave, the fifth convex, and the sixth concave. Denoting a concave mirror with a 'P' (positive optical power) and a convex mirror with an 'N' (negative optical power), the configuration of the first embodiment may be described as "PPNPNP".

The convex third mirror is advantageous because it allows the system to achieve lower chief ray angles of incidence. These angles of incidence are lower by up to 4° per surface. As discussed, lower incidence angles are advantageous, particularly in EUV systems, because they result in higher reflectivities and reduced phase errors and amplitude.

The concave first mirror is advantageous because it allows the system to be made doubly telecentric allowing a transmission mask to be used. Double telecentricity means that the chief rays CR may pass through the transmission mask at normal incidence, as well as impinge upon the wafer at normal incidence, and be parallel to the optical axis of the system. In addition, the split of optical power between concave mirror M1 and concave mirror M2 allows the ringfield width to scale beyond a 2.0 mm affording an increase in throughput.

The absolute values of the mirror radii are, from the object to the image as a fraction of the system focal length, 7.7497, 3.4420, 1.4669, 2.5370, 1.0548 and 1.2033 all to within around 10%. The axial separations of the mirrors, as a fraction of the system focal length, are 1.4151 (first concave to second concave mirror), 1.4155 (concave secondary to convex tertiary mirror), 3.0736 (convex tertiary to concave quaternary mirror), 3.0736 (concave quaternary to convex quintanary), −0.9905 (convex quintanary to concave sextanary) and 1.0955 (convex sextanary to wafer), all to within around 10%. All the mirrors are aspheric surfaces with 4th, 6th, 8th, 10th, and 12th order polynomial deformations.

Mirror M1 images the virtual entrance pupil located behind the mirror to the surface of mirror M2. A physical aperture stop is located at mirror M2 ensuring that each imaging bundle is defined in a like manner so that the imagery is stationary. In other words, the image quality (ignoring the effect of aberrations) is independent of field position.

Mirrors M2–M4 work in conjunction with mirror M1 and can be considered imaging group G1. Group G1 forms a minified image of the mask after mirror M4. Imaging group G2 consists of mirror M5 and mirror M6.

Group G2 relays an intermediate image (I) formed by Group G1 to the wafer at the proper reduction, which in this embodiment is 4×. The intermediate image I is preferably formed near the sixth mirror a substantial distance from each of the third and fourth mirrors, to the short conjugate side thereof. By substantial, it is meant that the third and fourth mirrors do not represent a field mirror pair. Advantages of this intermediate image I location include lowered chief ray incidence angles and facilitated clearance of mirrors M5 and M6.

Group G2 also forms an image of the virtual pupil plane location behind mirror M5 at infinity, making the imaging bundles telecentric at the wafer plane. In this embodiment, group G1 works a magnification of around −0.8×while group G2 works at a magnification of around −0.3×, providing a magnification from mask to wafer of around 0.25×, or a reduction of 4×.

In a system with an even number of bounces, it is possible to locate the mask and wafer on opposing sides of the imaging system to allow for unrestricted travel of the synchronous scanning stages. To enable unrestricted travel, the projection system has sufficient clearance at each conjugate. Clearance can be a problem at the wafer since the solid angle of the imaging bundles is a maximum at this location. This problem is exacerbated for all-reflective systems since the rays must pass freely around the mirrors to avoid clipping or vignetting (this is not true for dioptric or catadioptric systems where the light passes through lens elements). A measure of the clearance is the working distance at the wafer, and the back working distance is defined here to be the distance from the vertex of mirror M5 to the wafer (thus ignoring the finite thickness of mirror M5). In this preferred embodiment the back working distance is around 47 mm, which is at least a factor 2× larger than systems representing the state of the art. Complete data for reconstructing the system of FIG. 5 are contained in Table 1.

For convenience, the prescription of the first embodiment of FIG. 5 has been listed in Code V ™ format in Table 1. The mirrored surfaces are numbered 1–6 with surface S1 corresponding to mirror M1, S2 corresponding to mirror M2, and so on. Two additional surfaces complete the description with S0 and IMG representing the mask (object) and wafer (image) planes, respectively. After the surface number, there are two additional entries that list the radius of curvature (R) and the vertex to vertex spacing between the optical surfaces. The ASP entry after each surface denotes a rotationally symmetric conic surface with higher-order polynomial deformations. The aspheric profile is uniquely determined by its K, A, B, C, D, and E values. Each mirror uses 4th, 6th, 8th, 10th, and 12th order polynomial deformations. The sag of the aspheric surface (through 12th order) in the direction of the z-axis (z) is given by:

$$z = \frac{ch^2}{1+\sqrt{1-(1+k)c^2h^2}} + Ah^4 + Bh^6 + Ch^8 + Dh^{10} + Eh^{12}$$

where h is the radial coordinate; c is the curvature of the surface (1/R); and A, B, C, D, and E are the 4th, 6th, 8th, 10th, and 12th order deformation coefficients, respectively.

TABLE 1.0

| | Optical Design Prescription | | |
|---|---|---|---|
| OBJ: | RDY | THI | GLA |
| 1: | INFINITY | 787.392402 | |
| | −3450.93589 | −630.155208 | REFL |

TABLE 1.0-continued

Optical Design Prescription

| OBJ: | RDY | THI | GLA |
|---|---|---|---|
| ASP: | | | |
| K: −38.299224 | | | |
| A: 0.0000E 00 | B: 0.282365E−15 | C: 0.730144E − 20 | D: 0.544186E − 25 |
| E: −.247051E − 29 | F: 0.000000E + 00 | G: 0.000000E + 00 | H: 0.000000E + 00 |
| | STO: 1532.71144 | 630.310821 | REFL |
| ASP: | | | |
| K: −15.017493 | | | |
| A: 0.000000E + 00 | B: −.797760E − 14 | C: −.700433E − 19 | D: −.784265E − 24 |
| E: 0.223019E− 29 | F: 0.000000E + 00 | G: 0.00000E + 00 | H: 0.00000E + 00 |
| 3: | 653.21356 | −702.980548 | REFL |
| ASP: | | | |
| K: 0.146559 | | | |
| A: 0.00000E + 00 | B: 0.576140E − 15 | C: −.122689E − 18 | D: 0560985E − 23 |
| E: −.158267E− 27 | F: 0.000000E + 00 | G: 0.000000 + 00 | H: 0.00000E + 00 |
| 4: | 1129.74922 | 1368.678937 | REFL |
| ASP: | | | |
| K: 0.013731 | | | |
| A: 0.00000E + 00 | B: 0.514091E − 17 | C: −.316462E − 22 | D: 0.128041E − 27 |
| E: −.257739E− 33 | F: 0.000000E + 00 | G: 0.00000E + 00 | H: 0.00000E + 00 |
| 5: | 469.71111 | −441.069409 | REFL |
| ASP: | | | |
| K: 5.109912 | | | |
| A: 0.000000E + 00 | B: −.974662E − 13 | C: −.838936E − 17 | D: −.289808E − 21 |
| E: −.355934E− 25 | F: 0.000000E + 00 | G: 0.00000E + 00 | H: 0.00000E + 00 |
| 6 | 535.82146 | 487.822906 | REFL |
| ASP: | | | |
| K: 0.126157 | | | |
| A: 0.00000E + 00 | B: 0.141195E − 15 | C: 0.954716E − 21 | D: 0.595577E − 26 |
| E: 0.743605E− 32 | F: 0.000000E + 00 | G: 0.00000E + 00 | H: 0.00000E + 00 |
| IMG: INFINITY | 0.000000 | | |

SPECIFICATION DATA

| | | | |
|---|---|---|---|
| NAO | 0.06250 | | |
| DM | MM | | |
| WL | 13.40 | | |
| REF | 1 | | |
| WTW | 1 | | |
| XOB | 0.00000 | 0.00000 | 0.00000 |
| YOB | 116.00000 | 120.00000 | 124.00000 |
| VUY | 0.00000 | 0.00000 | 0.00000 |
| VLY | 0.00000 | 0.00000 | 0.00000 |

The specification data has also been included in Table 1 for the preferred embodiment. The numerical aperture at the object (NAO) is 0.0625 radians; this specification sets the angular divergence of the imaging bundles at the mask. The YOB designation defines the extent of the ring field in the scan dimension. The ring field is centered at 120 mm above the optical axis (OA) which contains the parent vertex of each of the mirrors. This field extends from 116 mm to 124 mm giving a ring that is 8 mm wide at the mask. At 4×reduction, the ring field becomes 2.0 mm wide at the wafer plane.

Performance Summary of First Embodiment

Figure 6:
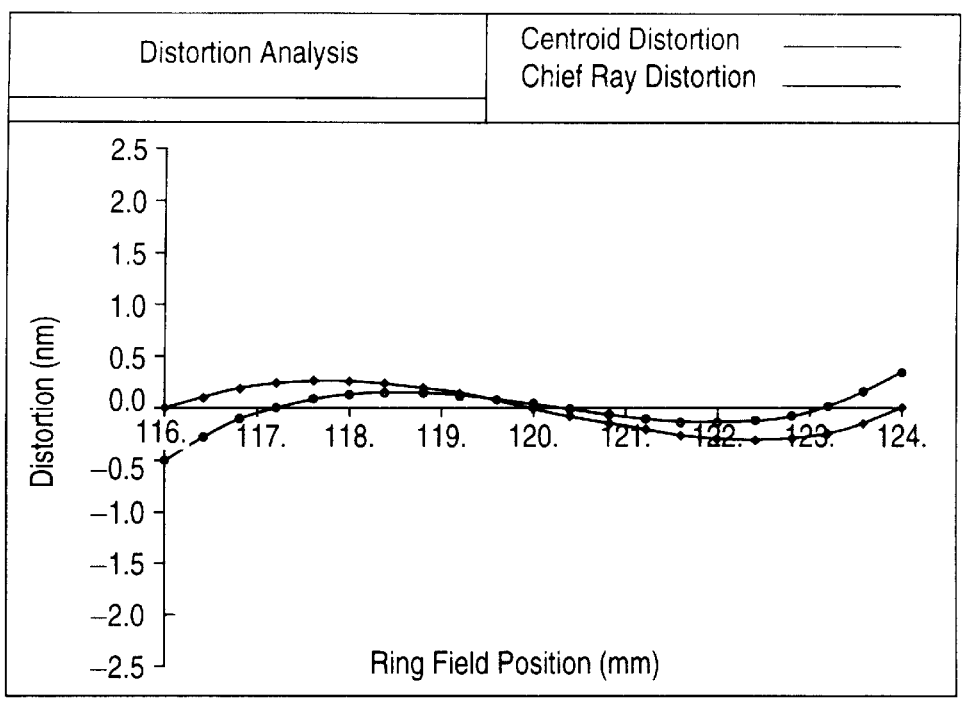
FIG. 6 shows the static distortion as a function of ring field position for the system of FIG. 5

Table 2 summarizes the performance of the PPNPNP configuration of FIG. 5, with the detailed distortion analysis being shown in FIG. 6 and Table 3. As discussed above, the optical system of FIG. 5 has very low incidence angles. The system preferably does not include a field group near the intermediate image. The intermediate image is located between mirrors M4 and M5 to maximize ray clearance in the aft end of the system. The NA is 0.25 and the ring field width is 2 mm (centered on a radius of 30 mm) at the wafer. The composite RMS wavefront error is 0.018λ(0.24 nm), and the static distortion is corrected to better than 0.31 nm. The system of FIG. 5 may be scaled in either NA or field. For example, the RMS wavefront error is only 0.0278 (0.36 nm) when the NA is scaled to 0.28, representing a RMS error without reoptimization at the higher NA. Alternatively, the ring field width can be scaled to in excess of 2 mm.

The length or total track from mask to wafer is 1500 mm. This system exhibits very low incidence angles, as measured by the chief ray from the field point, ranging from 3.3° to 12.0°. Due to the variation in ray angles across mirrors M1 and M5, these mirrors are candidates for graded multilayers. The chief ray incidence angles from the central field point are: Mask: 4.0°; M1: 5.0°; M2: 6.0°; M3: 12.0°; M4: 3.3°, M5: 8.8°, and M6: 3.3°. This design uses a low incidence angle at the mask to minimize image placement errors that may otherwise result from errors in the longitudinal position of the mask.

In addition to the low incidence angles, a preferred system in accord with the present invention utilizes low peak aspheric departure. The maximum peak departure, contained on mirror M1, is 15.0 μm. The other mirrors have low-risk aspheres with departures that range from 0.5 μm to 13 μm, consistent with the current alpha tool experience. As discussed above, low aspheric departures of the mirror surfaces facilitate visible light metrology testing without a null lens or CGH, resulting in a high degree of accuracy.

TABLE 2.0

Summary Data (031298a)

| Metric | Performance |
|---|---|
| Wavelength | 13.4 mm |
| Numerical aperture | 0.25 |
| Ringfield format | |
| i. Radius | 30.0 mm |
| ii. Width | 2.0 mm |
| iii. Chord | 26.0 mm |
| Reduction ratio (nominal) | 4:1 |
| Residual RMS wavefront error (waves @ $\lambda$ = 13.4 nm) | |
| i. F1 - 116 mm | 0.014$\lambda$ |
| ii. F2 - 118 mm | 0.015$\lambda$ |
| iii. F3 - 120 mm | 0.024$\lambda$ |
| iv. F4 - 122 mm | 0.014$\lambda$ |
| v. F5 - 124 mm | 0.020$\lambda$ |
| Chief ray distortion (max) | −0.31 nm |
| Exit pupil location | Infinity |
| Aperture stop | Accessible on M2 |
| Maximum aspheric departure across Instantaneous clear aperture (ICA) | |
| i. M1 | 15.0 $\mu$m |
| ii. M2 | 0.5 $\mu$m |
| iii. M3 | 13.0 $\mu$m |
| iv. M4 | 2.6 $\mu$m |
| v. M5 | 5.0 $\mu$m |
| vi. M6 | 6.3 $\mu$m |

TABLE 3.0

Chief ray and centroid distortion (031298a)

| Ideal image point (mm) | Chief ray distortion (nm) | Centroid distortion (nm) |
|---|---|---|
| 29.0 | −0.01 | −0.47 |
| 29.2 | 0.20 | −0.11 |
| 29.4 | 0.27 | 0.11 |
| 29.6 | 0.25 | 0.17 |
| 29.8 | 0.14 | 0.14 |
| 30.0 | 0.00 | 0.05 |
| 30.2 | −0.15 | −0.05 |
| 30.4 | −0.26 | −0.12 |
| 30.6 | −0.31 | −0.12 |
| 30.8 | −0.24 | 0.03 |
| 31.0 | −0.01 | 0.37 |

Second Preferred Embodiment: PNNPNP Optical Reduction System

Figure 7:
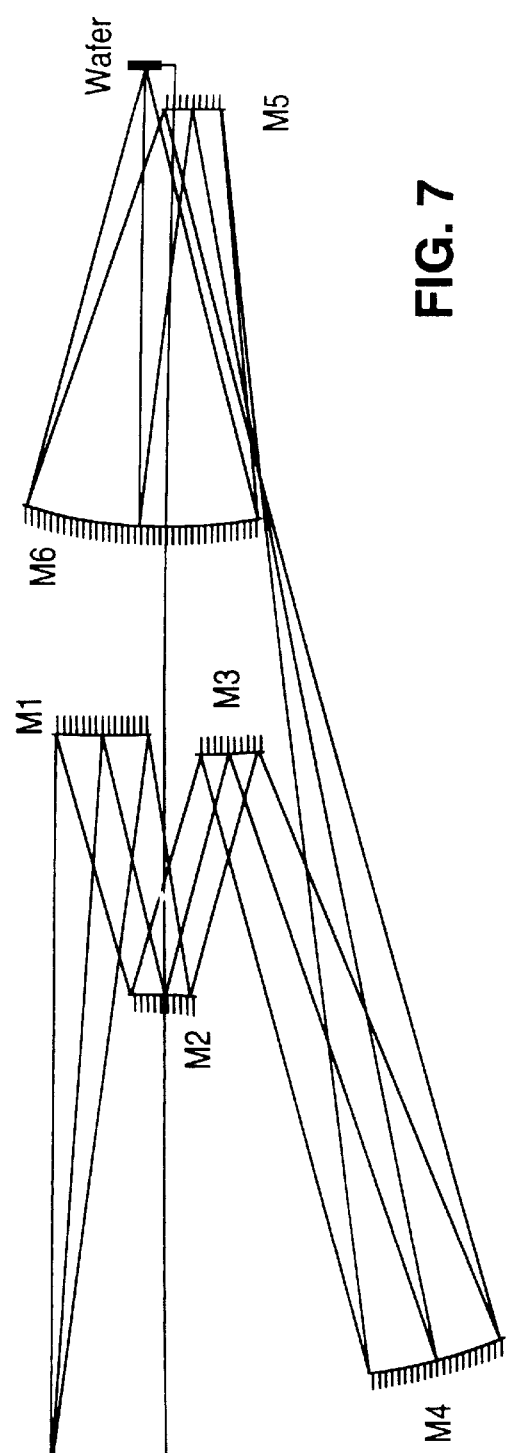
FIG. 7 shows a projection lithography optical system including an optical system in accord with a second embodiment of the present invention.

A second embodiment of an EUV optical projection system according to the present invention is shown in FIG. 7. The radii, aspheric prescription, and the axial separation of the mirrors can be found in Table 4. Specification data as defined at the plane of the mask are also included in Table 4.

In the second embodiment of the present invention shown in FIG. 7, from long conjugate to short conjugate, the first mirror is concave, the second convex, the third convex, the fourth concave, the fifth convex, and the sixth concave. Denoting a concave mirror with a 'P' (positive optical power) and a convex mirror with an 'N' (negative optical power, the configuration may alternately be described as PNNPNP. The absolute values of the mirror radii are, from the object to the image as a fraction of the system focal length, 2.2401, 5.2694, 2.2435, 2.7526, 1.0804, and 1.3129 all to within around 10%. The axial separations of the mirrors, as a fraction of the system focal length, are 0.6974 (first convex to second concave mirror), 0.6266 (concave secondary to convex tertiary mirror), 1.8641 (convex tertiary to concave quaternary mirror), 3.2723 (concave quaternary to convex quintanary), 1.0619 (convex quintanary to concave sextanary), and 1.2264 (concave sextanary to wafer) all to within around 10%. All the mirrors are conic surfaces with 6th, 8th, 10th, order polynomial deformations. A physical aperture stop is again preferably located at mirror M2. The back working distance of the second embodiment is around 65 mm, which is at least a factor of 2×larger than systems that represent the state of the art.

Complete data needed to reconstruct the optical reduction system is contained in Table 4. The numerical aperture at the object (NAO) is 0.0625 radians; this specification sets the angular divergence of the imaging bundles at the mask. The YOB designation defines the extent of the ring field in the scan dimension. The ring field is centered at 120 mm above the optical axis (OA) which contains the parent vertex of each of the mirrors. This field extends from 116 mm to 124 mm giving a ring that is 8 mm wide at the mask. At 4×reduction, the ring field becomes 2.0 mm wide at the wafer plane.

PNNPNP Performance Summary

Figure 8:
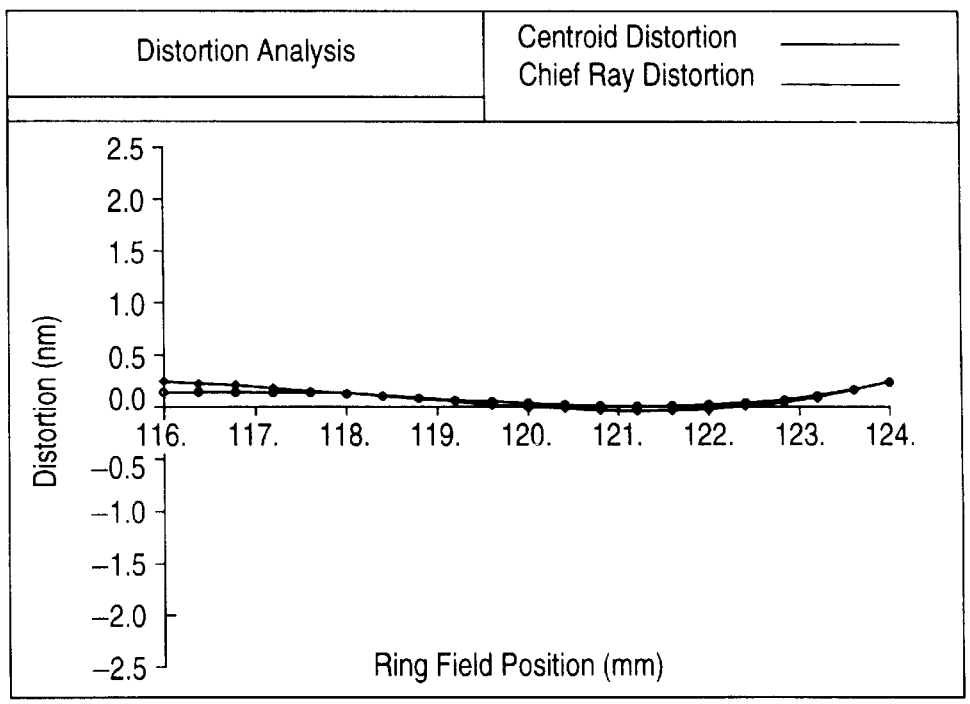
FIG. 8 shows the static distortion as a function of ring field position for the system of FIG. 7.

Table 5, in conjunction with the distortion analysis shown in FIG. 8 and Table 6, summarizes the performance of the second preferred embodiment shown in FIG. 7. The PNNPNP configuration of FIG. 7 achieves a high level of low-order aberration correction using just the base spherical surfaces. By aspherizing the mirrors, lithographic levels of performance are obtained. At a numerical aperture of 0.25, the design has a composite RMS wavefront error of 0.012$\lambda$ (0.16 nm) and less than 0.25 nm of distortion across its 2 mm ring field.

Based on the low residual wavefront error and corresponding Zernike decomposition of the wavefront, it is apparent that the design exhibits robust lithographic performance. Asymmetric aberrations to all orders are virtually eliminated. And the impact of residual even-order aberrations will be nullified via scan averaging. The system of FIG. 7 may be further increased in NA or ring field width. Numerical apertures in excess of 0.25 or field widths in excess of 2 mm are possible.

TABLE 4.0

Optical Design Prescription

| OBJ: | RDY | THI | GLA |
|---|---|---|---|
| 1: | INFINITY | 853.088868 | |
| | −884.24901 | −275.277118 | REFL |
| ASP: | | | |
| K: −2.568087 | | | |
| A: 0.000000E + 00 | B: −.249449E-14 | C: 0.326185E-19 | D: −.308806E-24 |
| | STO: − 2079.98831 | 247.349533 | REFL |
| ASP: | | | |
| K: 61.688671 | | | |
| A: 0.000000E + 00 | B: −.686840E-13 | C: −.165948E-17 | D: −.162449E-22 |
| | 3: 885.59434 | −735.806697 | REFL |
| ASP: | | | |
| K: −6.390777 | | | |

TABLE 4.0-continued

Optical Design Prescription

| OBJ: | RDY | THI | GLA |
|---|---|---|---|
| A:<br>0.000000E + 00 | B:<br>0.443004E-14<br>1086.55528 | C:<br>−.981256E-19<br>1291.683808 | D:<br>0.643453E-24<br>REFL |
| 4:<br>ASP:<br>K: −0.011987 | | | |
| A:<br>0.000000E + 00 | B:<br>0.847450E-18<br>426.46618 | C:<br>0.226667E-23<br>−419.170197 | D:<br>−.615312E-29<br>REFL |
| 5:<br>ASP:<br>K: 1.574688 | | | |
| A:<br>0.000000E + 00 | B:<br>0.216838E-12<br>518.23488 | C:<br>−.855144E-17<br>484.113983 | D:<br>0.190246E-21<br>REFL |
| 6:<br>ASP:<br>K: 0.057682 | | | |
| A:<br>0.000000E + 00 | B:<br>0.934362E-16 | C:<br>0.467721E-21 | D:<br>0.290089E-26 |
| IMG: INFINITY | 0.000000 | | |

SPECIFICATION DATA

| NAO | 0.06250 | | |
|---|---|---|---|
| DIM | MM | | |
| WL | 13.40 | | |
| REF | 1 | | |
| WTW | 1 | | |
| XOB | 0.00000 | 0.00000 | 0.00000 |
| YOB | 116.00000 | 120.00000 | 124.00000 |

The design has a total track length of around 1450 mm that is only 3.67× its focal length. The peak aspheric departure is around 1 5.0 μm and is located on mirror M1 for this focal length. The other mirrors have peak departures that range from 0.5 μm to 11.0 μm, for this focal length. This is significant since these low departures lower mirror fabrication and metrology risk, as well as alignment sensitivity. As a result of the novel distribution of optical power and spacing between the mirrors, the incidence angles are well controlled so that the design is compatible with EUV multilayer coatings. For reference, the chief ray incidence angles are as follows: Mask 4.3°; M1: 7.9°; M2: 11.5°; M3: 14.7°; M4: 3.2°; M5: 9.2°; and M6: 3.3°.

While the present invention has been described in terms of the preferred embodiments above, those skilled in the art will readily appreciate that numerous modifications, substitutions, and additions may be made to the disclosed embodiments without departing from the spirit or scope of the invention.

TABLE 5.0.

Summary Data

| Metric | Performance |
|---|---|
| Wavelength | 13.4 nm |
| Numerical aperture | 0.25 |
| Ringfield format | |
| i. Radius | 30.0 mm |
| ii. Width | 2.0 mm |
| iii. Chord | 26.0 mm |
| Reduction ratio (nominal) | 4:1 |
| Residual RMS wavefront error | |
| (waves @ λ = 13.4 nm) | |
| i. F1 - 116 mm | 0.014λ |
| ii. F2 - 118 mm | 0.008λ |
| iii. F3 - 120 mm | 0.015λ |

TABLE 5.0.-continued

Summary Data

| Metric | Performance |
|---|---|
| iv. F4 - 122 mm | 0.008λ |
| v. F5 - 124 mm | 0.013λ |
| Chief ray distortion (max) | 0.27 nm |
| Exit pupil location | Infinity |
| Aperture stop | Accessible on M2 |
| Maximum aspheric departure across | |
| instantaneous clear aperture (ICA) | |
| i. M1 | 6.3 μm |
| ii. M2 | 4.0 μm |
| iii. M3 | 1.7 μm |
| iv. M4 | 4.5 μm |
| v. M5 | 10.0 μm |
| vi. M6 | 14.8 μm |

TABLE 6.0

Chief ray and centroid distortion

| Ideal image point (mm) | Chief ray distortion (nm) | Centroid distortion (nm) |
|---|---|---|
| 29.0 | 0.27 | 0.16 |
| 29.2 | 0.23 | 0.17 |
| 29.4 | 0.18 | 0.15 |
| 29.6 | 0.11 | 0.12 |
| 29.8 | 0.05 | 0.08 |
| 30.0 | 0.00 | 0.04 |
| 30.2 | −0.03 | 0.01 |
| 30.4 | −0.04 | 0.01 |
| 30.6 | −0.01 | 0.03 |
| 30.8 | 0.08 | 0.10 |
| 31.0 | 0.23 | 0.22 |

What is claimed is:

1. An all-reflective optical system for a projection photolithography camera having a source of EUV radiation, a wafer and a mask to be imaged on the wafer, comprising:
at least six reflecting surfaces for imaging said mask on said wafer, wherein a first reflecting surface, from long conjugate to short conjugate, is a first mirror having a concave reflecting surface, wherein five of the six reflecting surfaces has an aspheric departure of less than substantially 14 μm.

2. The system of claim 1, wherein the six reflecting surfaces are, from long conjugate to short conjugate, said first mirror having said concave reflecting surface;
a second mirror
a third mirror having a convex reflecting surface;
a fourth mirror having a concave reflecting surface;
a fifth mirror having a convex reflecting surface
a sixth mirror having a concave reflecting surface.

3. An all-reflective optical system for a projection photolithography camera having a source of EUV radiation, a wafer and a mask to be imaged on the wafer, comprising:
at least six reflecting surfaces for imaging said mask on said wafer, wherein a first reflecting surface, from long conjugate to short conjugate, is a first mirror having a concave reflecting surface, wherein each of the six reflecting surfaces has an aspheric departure of less than substantially 16 μm.

4. The system of claim 3, wherein the six reflecting surfaces are, from long conjugate to short conjugate, said first mirror having said concave reflecting surface;

a second mirror a third mirror having a convex reflecting surface;

a fourth mirror having a concave reflecting surface;

a fifth mirror having a convex reflecting surface a sixth mirror having a concave reflecting surface.

5. An all-reflective optical system for a projection photolithography camera having a source of EUV radiation, a wafer and a mask to be imaged on the wafer, comprising:

at least six reflecting surfaces for imaging said mask on said wafer, wherein a first reflecting surface, from long conjugate to short conjugate, is a first mirror having a concave reflecting surface, and four of the six reflecting surfaces each has an aspheric departure of less than substantially 6.6 $\mu$m.

6. The system of claim 5, wherein the six reflecting surfaces are, from long conjugate to short conjugate, said first mirror having said concave reflecting surface;

a second mirror a third mirror having a convex reflecting surface;

a fourth mirror having a concave reflecting surface;

a fifth mirror having a convex reflecting surface a sixth mirror having a concave reflecting surface.

\* \* \* \* \*